United States Patent [19]

Feamster

[11] Patent Number: 4,797,118

[45] Date of Patent: Jan. 10, 1989

[54] TEST ADAPTER FOR INTEGRATED CIRCUIT CARRIER

[75] Inventor: Kim L. Feamster, Ontario, Calif.

[73] Assignee: ITT Corporation, New York, N.Y.

[21] Appl. No.: 112,654

[22] Filed: Oct. 23, 1987

[51] Int. Cl.[4] .............................................. H01R 23/72
[52] U.S. Cl. ...................................... 439/264; 439/912
[58] Field of Search .................... 439/263, 264, 70, 71, 439/912, 269; 324/73 PC, 158 F, 158 P

[56] References Cited

U.S. PATENT DOCUMENTS

| 4,556,269 | 12/1985 | Andersson et al. | 439/368 |
| 4,689,556 | 8/1987 | Cedrone | 324/158 P |
| 4,735,580 | 4/1988 | Hansen et al. | 439/264 |

Primary Examiner—Neil Abrams
Attorney, Agent, or Firm—Thomas L. Peterson

[57] ABSTRACT

A test adapter is provided for connection to a SOIC (small outline integrated circuit) carrier which can be locked to the carrier during test, has a relatively low profile thereby increasing the adapter's stability, and is very simple in construction. The adapter includes a one piece integral frame having two slots in which a pair of contact housings are mounted. The sidewalls of the frame running along the slots are resilient so that they will deform when the contact housings are mounted into the slots. A cam device is mounted on the housings above the frame. When the cam device is actuated, it pivots the housings to bring the contacts thereon into firm engagement with the leads of the carrier.

4 Claims, 3 Drawing Sheets

TEST ADAPTER FOR INTEGRATED CIRCUIT CARRIER

BACKGROUND OF THE INVENTION

The present invention relates generally to a test adapter and, more particularly, to a test adapter for use with a SOIC (small outline integrated circuit) carrier or package.

A SOIC is a rectangular integrated circuit with inputs/output leads positioned on two of its four sides. The lead count ranges from eight pins to twenty-eight pins. There is presently available on the market today a test adapter for SOIC carriers which is somewhat similar to the test adapter for dual in-line (DIP) packages disclosed in U.S. Pat. No. Re. 28,064, except that it is smaller to accommodate the smaller SOIC carrier. The SOIC test adapter comprises two pivotally mounted contact housings. The adapter is operated by squeezing the two contact housings between the thumb and forefinger, similar to a clothespin. The contact housings rotate about a pivot pin located near the center of the device, thereby opening up the lower part of the adapter. The adapter is then positioned over the SOIC carrier and released. To remove the adapter one squeezes the top of the contact housings together and lifts the adapter up off the carrier.

The prior art SOIC adapter requires a heavy compression spring to provide the clamping force between the adapter and the carrier. In spite of the use of such compression spring, the adapter does not always drip the SOIC carrier securely. Furthermore, the adapter has a relatively high profile, which causes it to be somewhat unstable, with the result that occasionally the adapter will snap off the carrier with only minor movement or pressure. Further, often such a prior art SOIC adapter takes up more space when used to test circuit components on a board than is available.

Another prior art test adapter relevant to the present invention, which is designed for use with DIP's, comprises two contact frames which are pivotally mounted relative to each other by a longitudinally extending pin. Springs are mounted in the interior of the upper regions of the contact frames below the pivot pin, which tend to cause the lower ends of the frames to be biased apart. A rectangular shaped cam device surrounds the contact frames. When the cam device is pushed downwardly, the inside surfaces of the long sides of the device bear against the outside surfaces of the contact frames, camming them inwardly to cause the lower ends of the contacts in the frames to engage the leads on a chip carrier over which the clip is mounted.

Test adapters are also available and disclosed in the patent art which are used with PLCC's (plastic leaded chip carriers). PLCC's are flat four-sided integrated circuit packages with input/output leads on all four sides. The lead count ranges from 20 pins to 124 pins. U.S. Pat. Nos. 4,541,676; 4,671,590 and 4,671,592 disclose such test adapters. In each adapter, a spring is utilized either in conjunction with the contact housings, or latch arms which retain the adapter on the carrier. Copending application of W. D. Hansen entitled "Test Adapter for Integrated Circuit Carrier". Ser. No. 944,774, filed Dec. 22, 1986, now U.S. Pat. No. 4,735,580, assigned to the assignee of the present application, dislcoses a PLCC test adapter which is operated by placing the adapter over the PLCC, and then pushing down a locking wedge which rotates the outer contact housings about the center section of the adapter. When actuated, the contact housings grip the carrier leads on all four sides. This adapter does not utilize springs as do the other other PLCC adapters discussed above. However, because the Hansen adapter is constructed for use with PLCC's having leads on their four sides, it it not suitable for use with a SOIC.

It is the object of the present invention to provide a test adapter particularly suited for use with a SOIC carrier, which has a relatively low profile and therefore is stable, is simple in construction and avoids the use of springs.

SUMMARY OF THE INVENTION

According to a principal aspect of the present invention, there is provided an adapter for coupling to a circuit carrier, such as a SOIC carrier, having leads spaced in a row along two opposite sides. The adapter comprises a one piece integral frame having two parallel spaced slots formed therein. The slots define a relatively rigid support therebetween. A pair of contact housings, each having a set of contacts mounted thereon, are mounted vertically in the slots with the sides of the housings containing the contacts facing each other. The housings are pivotable about the sides of the rigid support of the frame. The housings are caused to pivot by means of a cam mechanism which is mounted on the housings. By depressing the cam mechanism, the upper portions of the housings are urged apart causing the housings to pivot about the sides of the rigid support of the frame, thereby bringing the contacts extending to the lower ends of the housing into firm engagement with the SOIC carrier leads. By raising the cam mechanism, the pressure on the lower ends of the contact housings is relieved, thereby allowing the test adapter to be removed from the carrier. Besides the contacts, the carrier requires only four parts, namely, the two contact housings, the cam mechanism and the frame in which the contact housings are mounted. There is no requirement for use of a spring, as found in the prior are SOIC adapters. Because of the construction of the adapter, it has a relatively low profile, thereby reducing the lever arm and consequently increasing the adapter's stability when mounted over the carrier. The adapter's short height and narrow width makes it possible to test carriers mounted in a dense pattern on a board.

Other objects, aspects and advantages of the invention will become apparent from the following description taken in connection with the accompanying drawings.

DESCRIPTION OF THE PREFERRED EMBODIMENT

Figure 1:
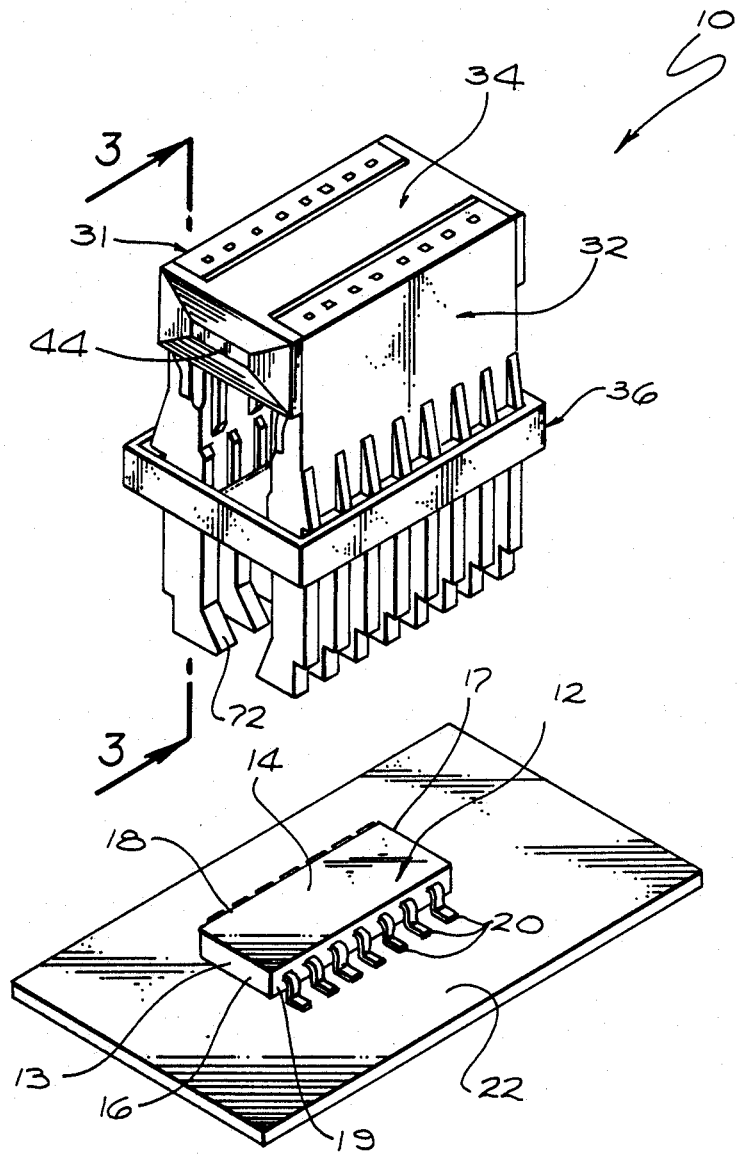
FIG. 1 is a perspective view of an adapter constructed in accordance with the present invention, with the contacts omitted, and a SOIC carrier mounted on a printed circuit board over which the adapter is designed to be mounted.

Referring now to the drawings in detail, FIG. 1 illustrates the test adapter of the present invention, generally designated 10, which is designed to engage an integrated circuit carrier 12 of the type which is commonly referred to as a small outline integrated circuit (SOIC) carrier. The carrier 12 has a housing 13 with a top surface 14 and four sides 16–19. A row of spaced electrically conductive leads 20 extends from two opposite sides 18 and 19 of the carrier housing onto solder pads (not shown) of a printed circuit board 22.

The adapter 10 includes contacts 24 that each have a lower end 69 that makes electrical connection with the leads 20 of the carrier, and which each have an upper end 26 that is easily accessible for connection to test instruments.

The carrier comprises, in addition to the contacts, only four parts, namely, a pair of contact housings 31 and 32, a cam mechanism 34 and a frame 36. The contact housings 31 and 32 are mounted in the frame 36, while the cam mechanism 34 is mounted above the frame between the upper portions of the contact housings. In use, the cam mechanism 34 is pushed downwardly toward the upper surface 14 of the carrier. This causes the contact housings 31 and 32 to be pivoted so their lower portions 37 move inwardly toward the vertical axis 38, causing the lower portions of the housings to latch against the sides 18 and 19 of the carrier housing 13. The cam mechanism has two end portions 44 that can be grasped by the thumb and forefinger and pushed down or up. It should be noted that while the carrier top surface 14 commonly lies in a horizontal plane so the adapter 10 is moved perpendicularly thereto onto and off of it, the parts can be used in a wide variety of orientations, and the terms "vertical" and "horizontal" used herein refer to the relative orientation of the parts.

Figure 2:
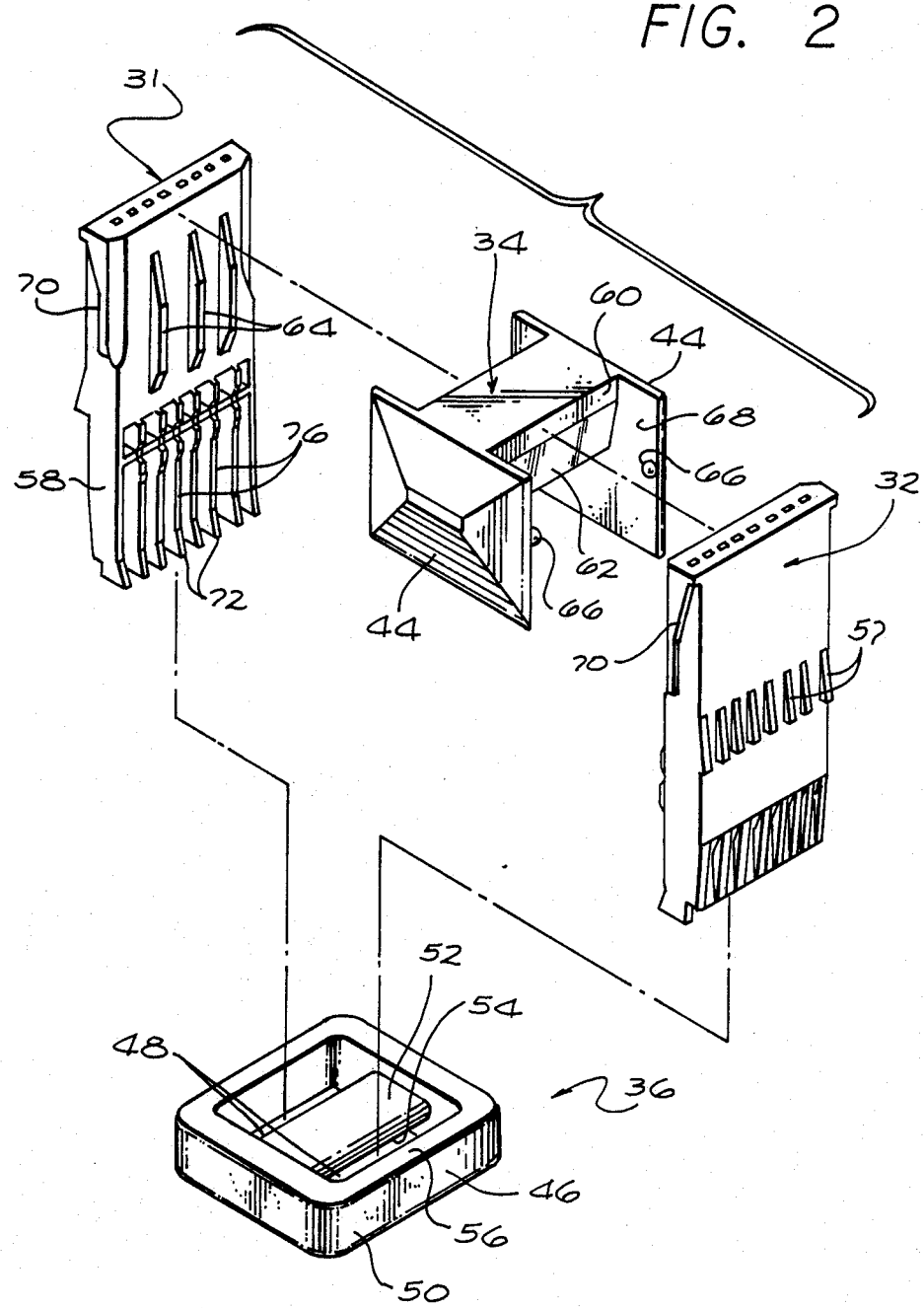
FIG. 2 is a perspective exploded view of the adapter of FIG. 1.

Reference is now made to FIG. 2 of the drawings, which shows in greater detail the construction of the various parts of the adapter 10.

The frame 36 is a one piece integral part comprising a generally rectangular plate 46 in which there are formed two parallel slots 48, each parallel to the relatively long sides 50 of the plate. The slots define therebetween a relatively rigid support 52 which has a vertical thickness less than the remainder of the plate 46, so that its upper and lower surfaces are spaced from the upper and lower surfaces, respectively, of the plate. Preferably the side edges 54 of the support 52 are rounded to provide pivot points for the contact housings 31 and 32 which are mounted vertically in the slots 48. The width of the slots 48 is such that the contact housings have a slight interference therein. The sidewalls 56 of the frame defined between the slots 48 and the sides 50 of the plate 46 are relatively thin so as to be capable of resiliently deforming when the housings are pushed down into the slots. As the lower portions 37 of the contact housings are pushed down into the slots 48, the sidewalls 56 will deform outwardly until the housings reach the position illustrated in FIG. 3 wherein the rounded sides 54 of the support 52 of frame 36 will snap into transverse grooves 58 formed in the inner faces of the housings. By this arrangement, with the resilient sidewalls 56 of the frame 36 and the engagement of the rounded sides 54 of the support 52 in the grooves 58, the contact housings are releasably retained in the frame in a predetermined vertical position. The retaining tabs 57 on the outside surfaces of the contact housings also serve to hold the housing in their proper position in the frame.

Figure 3:
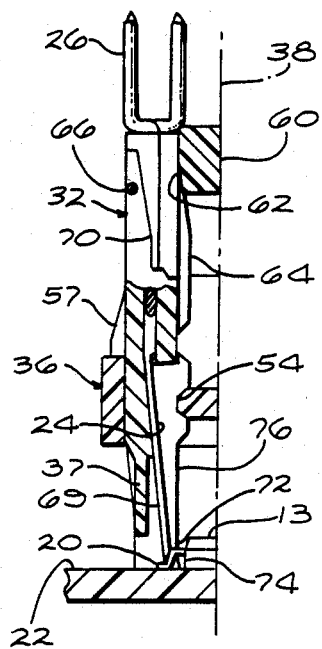
FIG. 3 is a sectional view taken along the line 3—3 of FIG. 1, with the adapter engaged with the carrier except that the adapter contact housing has not been pivoted to a fully engaged position.

The cam mechanism 34 is mounted between the upper portions of the contact housings 31 and 32 above the frame 36. The end portions 44 of the cam mechanism are joined by a transversely extending central portion 60 which extends between the contact housings. The opposite sides of the central portions 60 are formed with downwardly and inwardly inclined cam surfaces 62. The end portions 44 of the cam mechanism 34 are positioned outside of the contact housings 31 and 32 where they are conveniently located for gripping by the user, facilitating shifting of the cam mechanism between the upper and lower positions illustrated in FIGS. 3 and 4, respectively. In the normal upper position of the cam mechanism 34, as illustrated in FIG. 3, the cam surfaces 62 are positioned just above corresponding tracks or cam followers 64 formed on the inner surfaces of the contact housings 32. When the cam mechanism is moved down from the position illustrated in FIG. 3 to that illustrated in FIG. 4, the cam surfaces 62 ride across the cam followers 64, causing the lower portions 36 of the contact housings to move toward the carrier 12.

Figure 4:
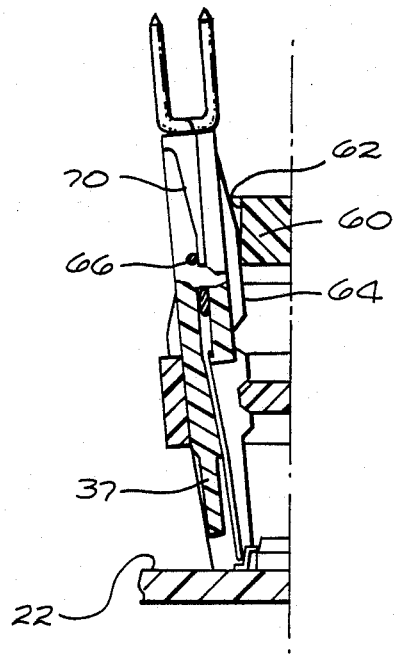
FIG. 4 is a view similar to FIG. 3, with the contact housing shown in its fully engaged position.
Figure 5:
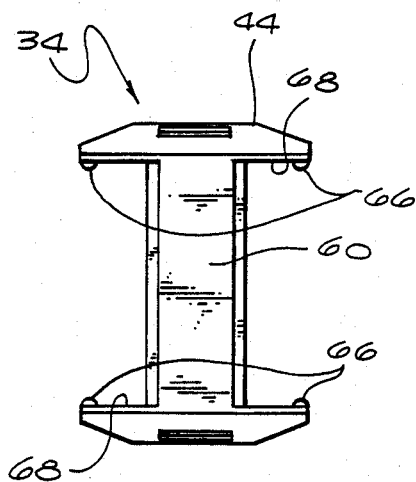
FIG. 5 is a top plan view of the cam device used in the adapter.

As best seen in FIG. 5, cam buttons 66 are formed on the inner faces 68 of the end portions 44 of the cam mechanism. The buttons are positioned to engage cam tracks 70 formed on the outsides of the contact housings 32. When the cam mechanism is moved up from the position illustrated in FIG. 4 to that illustrated in FIG. 3, the cam buttons 66 ride along the cam tracks 70 causing the lower ends 37 of the contact housings to move away from the carrier 12.

FIG. 3 shows the adapter initially positioned over the carrier 12, but not yet latched to the carrier. During downward movement of the adapter, the lower part 69 of the contacts wipe across the carrier leads 20 make wiping contact therewith. Then, the cam mechanism 34 is moved down to pivot the contact housings about the corresponding pivot points 54, causing an inclined latch surface 72 on the lower portion of each contact housing to move against a lower, inclined locking surface 74 on the side of the carrier housing. Both of these engaging surfaces extend at essentially the same angle from the vertical so that the surfaces will essentially match when engaged, as seen in FIG. 4, to thereby provide firm latching of the adapter to the carrier housing. Thus, the adapter will not lift off of the carrier so long as the contact housings are pivoted to their latched positions as illustrated in FIG. 4.

The lower portion of each contact housing includes a row of vertical barriers or separaters 76, which can be best seen in FIG. 2. the barriers each have a width slightly less that the separation between the adjacent leads 20 on the carrier to allow the barriers to move through the space between the leads and directly contact the sides of the carrier. The contacts lie in the slots formed between the barriers. The barriers also assure accurate lateral alignment of the lower portions 69 of the contacts with the carrier leads 20 to assure contact between them and to prevent an adapter contact lower portion 69 from simultaneously engaging two carrier leads to short circuit them.

The entire adapter, except for the contacts, can be constructed of plastic molded parts. No metal spring or the like is required. This avoids the use of metal parts that can either corrode or which must be of a high cost metal to avoid corrosion. The contacts are typically gold plated to assure minimal contact resistance and, to resist corrosion.

It will be appreciated from the foregoing that the adapter of the present invention is relatively simple and inexpensive, since it comprise only four molded parts which can be readily assembled without the use of any tools. The cam mechanism 34 assures that a uniform, adequate pressure is applied on the sides of the carrier so that the adapter will be firmly secured thereto. The height of the adapter is relatively short, thereby reducing the lever arm that exists with the prior art SOIC test adapters and, as a result, increases the stability of the adapter when mounted on the carrier. Because the sidewalls 56 of the frame which mounts the contact housing are relatively thin, the adapter has a relatively narrow width making it possible to use the adapter on a carrier which is mounted in a dense arrangement with other carriers or devices.

Although only one embodiment of the invention has been disclosed herein for purposes of illustration, it will be understood that various changes can be made in the form, details, arrangement and proportions of the various parts in such embodiment without departing from the spirit and scope of the invention as defined by the appended claims.

What is claimed is:

1. An adapter for coupling to a circuit carrier including a carrier housing with opposite sides and a plurality of leads spaced in a row along said sides, comprising:
   a one-piece integral frame embodying two spaced slots parallel to each other:
   said slots defining a relatively rigid support therebetween:
   said frame having two opposite sides;
   said slots being parallel to said sides and defining relatively resilient sidewalls adjacent to said sides:
   a pair of contact housings each having a set of contacts mounted on one side thereof;
   said housings being mounted vertically in said slots with the sides mounting said contacts facing each other;
   said sidewalls deforming outwardly when said housings are mounted into said slots;
   said housings being pivotable about the sides of said rigid support; and
   cam means mounted on said housings movable between first and second positions, in said first position said cam means locating the lower ends of said housings so that said contacts can be disposed over said leads with little or no resistance, and shifting of said cam means from said first position to said second position pivots said housings to cause said lower ends thereof to be urged toward each other to press said contacts firmly against said leads.

2. An adapter as set forth in claim 1 including:
   means on said housings for retaining said housings in said slots.

3. An adapter for coupling to a circuit carrier including a carrier housing with opposite sides and a plurality of leads spaced in a row along said sides comprising:
   a pair of contact housings each having a set of contacts mounted on one side thereof;
   means mounting said housings vertically with said sides mounting said contacts facing each other;
   cam means associated with said housings movable between first and second positions in said first positions said cam means locating the lower ends of said housings so that said contacts can be disposed over said leads with little or no resistance, and shifting of said cam means from said first position to said second position pivots said housings to cause said lower ends thereof to be urged toward each other to press said contacts firmly against said leads;
   said mounting means comprising a one-piece integral frame having two opposite sides and embodying two spaced slots parallel to each other and said sides, said slots receiving said housings; and
   said slots defining relatively resilient sidewalls adjacent to said sides, said sidewalls deforming outwardly when said housings are mounted in said slots.

4. An adapter for coupling to a circuit carrier including a carrier housing with opposite sides and a plurality of leads spaced in a row along said sides, comprising:
   a one-piece integral frame embodying two spaced slots parallel to each other;
   said slots defining a relatively rigid support therebetween;
   a pair of contact housings each having a set of contacts mounted on one side thereof;
   said housings being mounted vertically in said slots with the sides mounting said contacts facing each other;
   said housings being pivotable about the sides of said rigid support;
   cam means mounted on said housings movable between first and second positions, in said first position said cam means locating the lower ends of said housings so that said contacts can be disposed over said leads with little or no resistance, and shifting of said cam means from said first position to said second position pivots said housings to cause said lower ends thereof to be urged toward each other to press said contacts firmly against said leads;
   said cam means comprising a central portion and two end portions;
   said central portion extending between said housings above said frame;
   said housings having vertically extending side edges; and
   said end portions of said cam means extending over said housing side edges for facilitating movement of said cam means by an operator by engaging said end portions.

* * * * *